United States Patent
Song (10) Patent No.: US 6,433,581 B1
(45) Date of Patent: Aug. 13, 2002

(54) CONFIGURABLE DYNAMIC PROGRAMMABLE LOGIC ARRAY

(75) Inventor: Seungyoon P. Song, Palo Alto, CA (US)

(73) Assignee: Elan Research, Mt. View, CA (US)

( * ) Notice: Subject to any disclaimer, the term of this patent is extended or adjusted under 35 U.S.C. 154(b) by 0 days.

(21) Appl. No.: 09/640,486

(22) Filed: Aug. 16, 2000

(51) Int. Cl.[7] .............................................. H03K 19/177
(52) U.S. Cl. .............................. 326/41; 326/38; 326/39; 326/44; 326/95; 326/98
(58) Field of Search .............................. 326/38, 39, 40, 326/41, 44, 95, 98

(56) References Cited

U.S. PATENT DOCUMENTS

| | | | | |
|---|---|---|---|---|
| 4,769,562 A | * | 9/1988 | Ghisio | 307/469 |
| 4,950,928 A | * | 8/1990 | Schnizlein | 307/468 |
| 5,926,038 A | * | 7/1999 | Fouts et al. | 326/95 |
| 6,023,179 A | * | 2/2000 | Klass | 327/11 |
| 6,075,385 A | * | 6/2000 | Dorweiler et al. | 326/93 |
| 6,229,338 B1 | * | 8/2001 | Coulman et al. | 326/41 |

* cited by examiner

Primary Examiner—Michael Tokar
Assistant Examiner—Vibol Tan
(74) Attorney, Agent, or Firm—Sawyer Law Group LLP (57) ABSTRACT

A configurable dynamic PLA in accordance with the present invention provides for multiple programs onto one dynamic PLA and allows one of the multiple programs to be selected at any given time, making the array "configurable" after the array is built. In addition, if the evaluate modules are made reprogrammable, the PLA is both configurable and reprogrammable. The capability to reprogram the array allows new functions to be realized after the array is built. The capability to configure the array allows any one of the preprogrammed functions—be it hardwired or reprogrammed—to be selected for each evaluation cycle. This is especially useful since reprogramming the array may take multiple cycles.

42 Claims, 12 Drawing Sheets

CONFIGURABLE DYNAMIC PROGRAMMABLE LOGIC ARRAY

FIELD OF THE INVENTION

The present invention relates generally to dynamic programmable logic arrays (DPLAs) and specifically to a DPLA that is configurable.

BACKGROUND OF THE INVENTION

A PLA (programmable logic array) produces a predetermined set of outputs for a given set of inputs. Each output is a sum-of-products of a subset of the inputs, implemented using an AND plane to generate the product terms and an OR plane to generate the sums of the product terms. A dynamic PLA implements the sum-of-products functions by precharging and conditionally discharging wired-NOR circuits that are built within the AND and OR arrays. These functions are programmed when a dynamic PLA is built such that the array can only produce the same set of output signals for a given set of input signals. A dynamic PLA is "programmable" only in the sense that it is easy to implement desired functions within the array when the array is built but not in the sense that the array can be programmed to provide different functions once the array is built.

Figure 1:
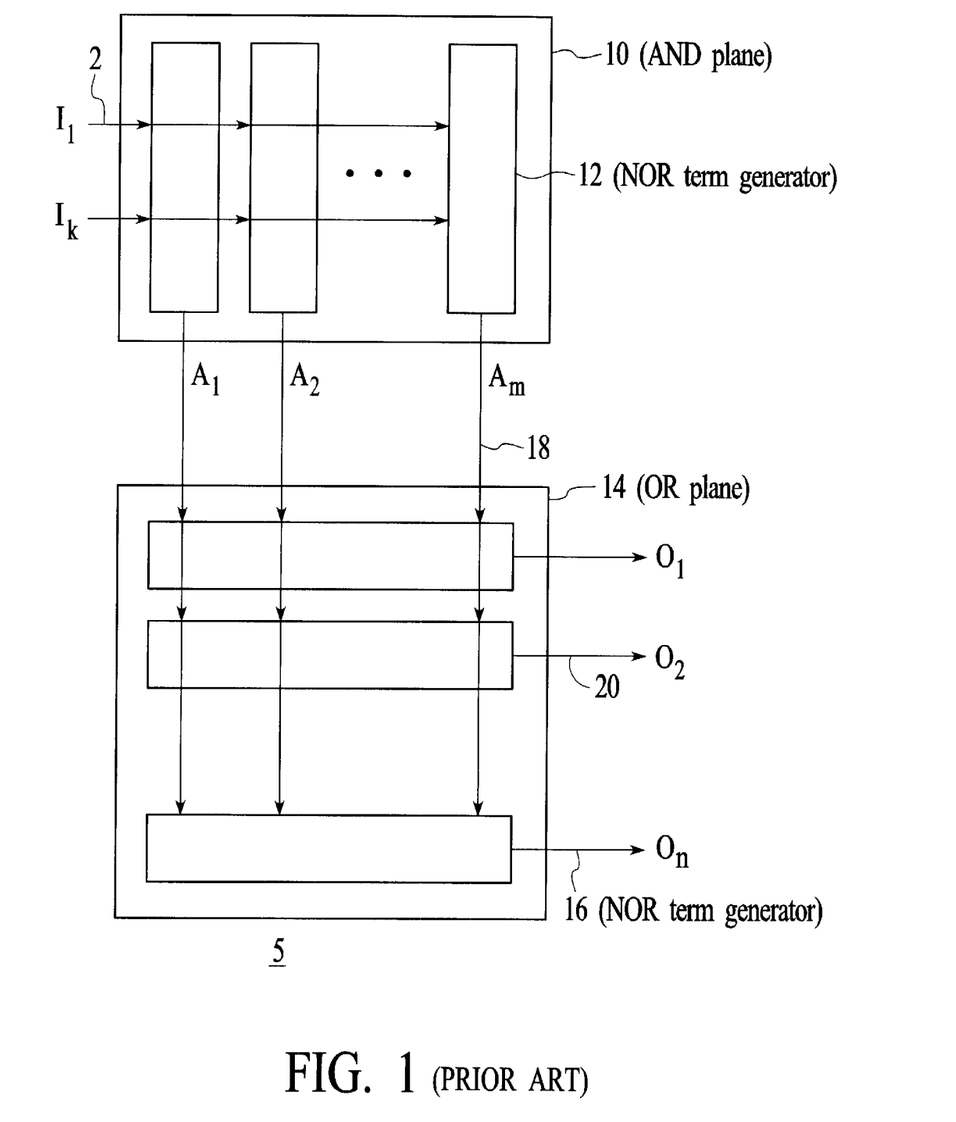
FIG. 1 shows a conventional dynamic programmable logic array (DPLA).

Dynamic programmable logic arrays (DPLAs) are utilized extensively. As shown in FIG. 1, a DPLA 5 includes input signals 2 to an AND plane 10 whose outputs 18 are then the inputs to an OR plane 14 that produces the output signals 20. The outputs of the AND plane 10 are known as AND term signals (A1 to Am). The outputs of the OR plane are known as OR term signals (O1 to On). FIG. 1 shows k number of inputs, m number of AND term signals, and n number of OR term signals. The AND plane 10 further comprises multiple NOR term generators 12, each of which outputs a wired-NOR signal 18 that is first precharged to Vcc (the supply voltage) and then conditionally discharged to GND (the ground voltage). The Vcc and GND can represent high (TRUE) and low (FALSE) logic states, respectively. Similarly, the OR plane 14 also comprises multiple NOR term generators 16, each of which outputs a wired-NOR signal 20 that is first charged to high logic level and then conditionally discharged to low logic level. For simplicity, the clocks that control the precharge and discharge are not shown in FIG. 1.

Figure 2:
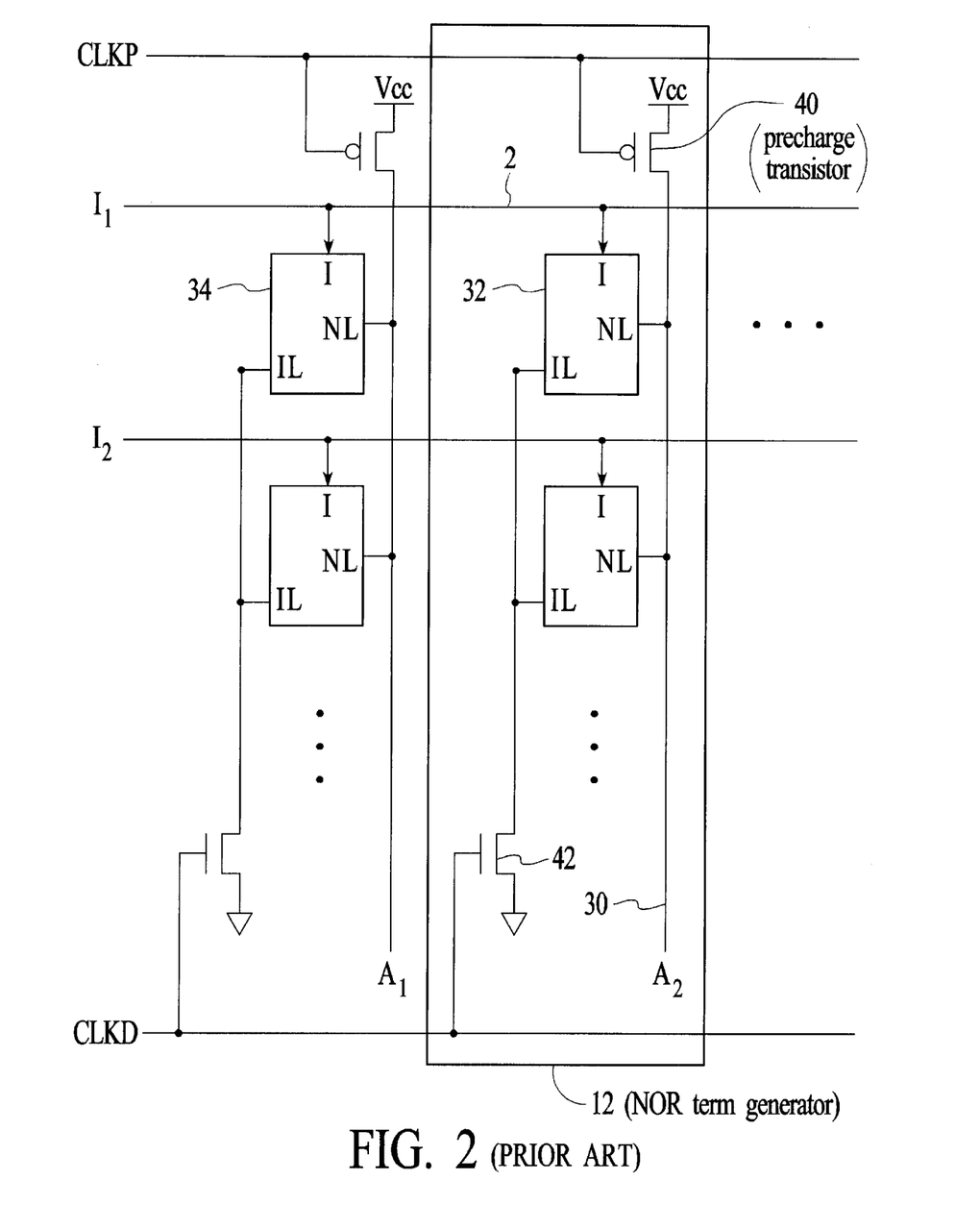
FIG. 2 shows two NOR term generators in the AND plane.

FIG. 2 shows two NOR term generators 12 in the AND plane. The wired-NOR signal 30 is discharged if one or more input signals 2 that are "programmed" to affect this output signal are high. An input signal 2 is programmed to affect an output signal by providing an evaluate circuitry 32 controlled by the input signal 2. FIG. 2 shows that the input signals I1 and I2 are programmed to affect the AND term signals A1 and A2. If the evaluate circuitry labeled 34 were not provided, for example, then the input signal I1 cannot affect the AND term signal A1 while it still affects the AND term signal A2.

Figure 3:
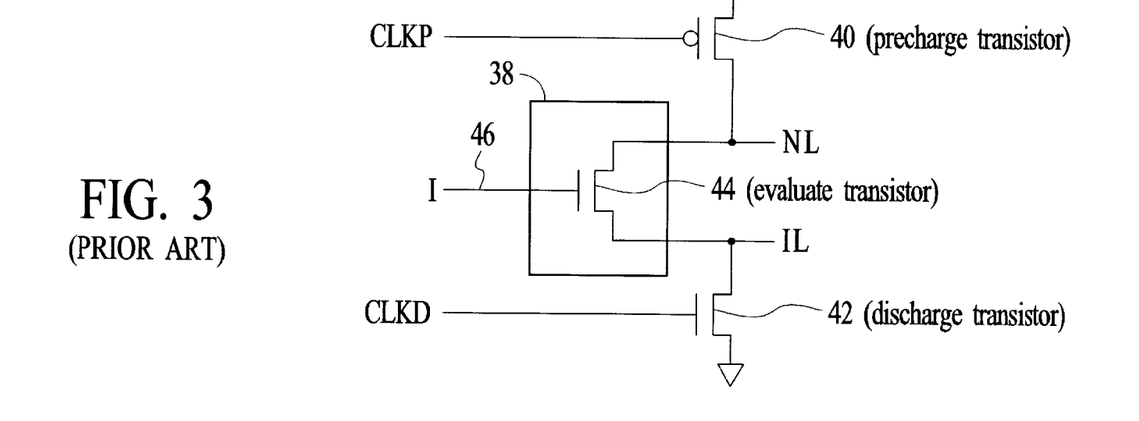
FIG. 3 shows a conventional evalute circuitry for DPLA and the precharge transistor and the discharge transistor for the AND term signal.

FIG. 3 shows a conventional evaluate circuitry 38 for DPLA and the precharge transistor 40 and the discharge transistor 42 for the AND term signal. This precharge and conditional discharge circuitry is controlled in two non-overlapping phases, known as precharge and evaluate. During the precharge phase, both CLKP and CLKD are held low so that precharge transistor 40 is turned on and the discharge transistor 42 is turned off, forcing the output signal NL to be high. During the evaluate phase, both CLKP and CLKD are held high so that the precharge transistor 40 is turned off and the discharge transistor 42 is turned on. During the evaluate phase, if the input signal 46 is high to turn on the evaluate transistor 44, then the charge stored at the output signal NL is discharged via the transistors 44 and 42, resulting in the signal NL being low. If on the other hand, if the input signal 46 is low during the evaluate phase, the evaluate transistor 44 is turned off and the charge stored at the output signal NL remains high. The input signal 46 must not change during the evaluate phase to avoid falsely discharging the output signal NL.

A NOR term generator 12, which comprises one precharge transistor and one discharge transistor and at least one evaluate circuitry, works as follows. During the precharge phase, the precharge transistor 40 is turned on and the discharge transistor 42 is turned off, forcing the output signal NL to be high. During the evaluate phase, the precharge transistor 40 is turned off and the discharge transistor 42 is turned on. During the evaluate phase, if one or more input signals that are programmed to affect this output are high, the charge stored at the output signal NL is discharged and NL becomes low. If none of the input signals are high, then there is no path for the charge stored at NL to be discharged and the NL remains high. The NOR term generators 16 in the OR plane 14 works as same as those in the AND plane 10.

A detailed description of DPLA can be found in "Principles of C-MOS VLSI Design" by N. H. Weste and K. Eshraghian, Addison-Wesley, $2^{nd}$ Edition, 1993, Chapter 8, pages 592–602 or in the U.S. Pat. No. 4,769,562.

Accordingly, a DPLA produces a predetermined set of outputs for a given set of inputs. Each output is a sum-of-products of a subset of the inputs. The DPLA implements the sum-of-products functions by precharging and discharging wired-NOR circuits that are built within the array. These functions are programmed when a dynamic PLA is built such that the array can only produce the same set of output signals for a given set of input signals. A dynamic PLA is "programmable" only in the sense that it is easy to implement desired functions within the array when the array is built but not in the sense that the array can be programmed to provide different functions once the array is built. Therefore, if a different function is desired the DPLA is inflexible and must be replaced after being programmed.

Accordingly, what is needed is a system and method for allowing a DPLA to be configurable. The present invention addresses such a need.

SUMMARY OF THE INVENTION

A configurable dynamic PLA in accordance with the present invention provides for multiple programs onto one dynamic PLA and allows one of the multiple programs to be selected at any given time, making the array "configurable" after the array is built. In addition, if the evaluate module are made reprogrammable, the PLA is both configurable and reprogrammable.

The capability to reprogram the array allows new functions to be realized after the array is built. The capability to configure the array allows any one of the preprogrammed functions—be it hardwired or reprogrammed—to be selected for each evaluation cycle. This is especially useful, since reprogramming the array may take multiple cycles.

DETAILED DESCRIPTION

The present invention relates generally to dynamic programmable logic arrays (DPLAs) and specifically to a DPLA that is configurable. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Dynamic PLA with Fine-Grained Control

Figure 4:
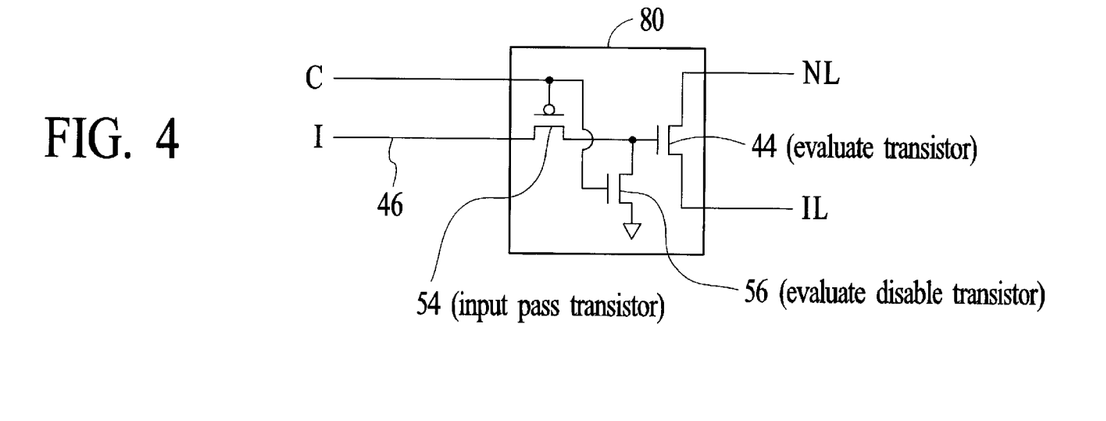
FIG. 4 shows a configurable evalute module for DPLA in accordance with the present invention.

The evaluate module 38 in FIG. 3 is replaced with the configurable evaluate module 80 in FIG. 4 in both the AND and OR planes to provide the complete control of the AND and OR term generators in the resulting PLA. That is, instead of using the evaluate module 38 only in the places where the input signals affect the AND term outputs and in the places where the AND term outputs affect the OR term outputs, a configurable evaluate module 80 is placed in everywhere so that every input signals can affect all AND term outputs and that every AND term output signal can affect all OR term outputs.

The configurable evaluate module 80 comprises an input pass transistor 54, an evaluate transistor 44, and an evaluate disable transistor 56. The control signal C enables either the input pass transistor 54 or the evaluate disable transistor 56 at any given time. When the input pass transistor 54 is turned on, the input signal 46 is allowed to affect the evaluate transistor 44, such that the evaluate transistor 44 is turned on or off if the input signal 46 is high or low, respectively. When the evaluate disable transistor 56 is turned on instead, the input signal 46 cannot affect the evaluate transistor 44.

This arrangement of configurable PLA results in a large number of control signals, since each conditional evaluate module 80 requires a dedicated control signal. For a PLA with K number of inputs, M number of AND terms, and N number of OR terms (or the outputs), a total of K×M+M×N=M×(K+N) number of control signals. With such a large number of control signals for a PLA, a preferred method of generating these control signals would be to store the control signals in a memory array (SRAM, DRAM, flash or one-time programmable memory). In this way, the array can be configured to produce any desired function by reading the control signals from the memory array. To avoid falsely discharging the evaluate transistors, the control as well as the input signals must not change during the evaluate phase.

Dynamic PLA with Built-in Configurations

Building the configurations into the array can minimize the required number of control signals. A configurable evaluate module 100 in FIG. 5 can be used instead of the configurable evaluate module 80 in FIG. 4 in every place so that every input signals can affect all AND term outputs and that every AND term output signal can affect all OR term outputs. This arrangement reduces the required number of control signals to L, where L is the number of different configurations.

Figure 5:
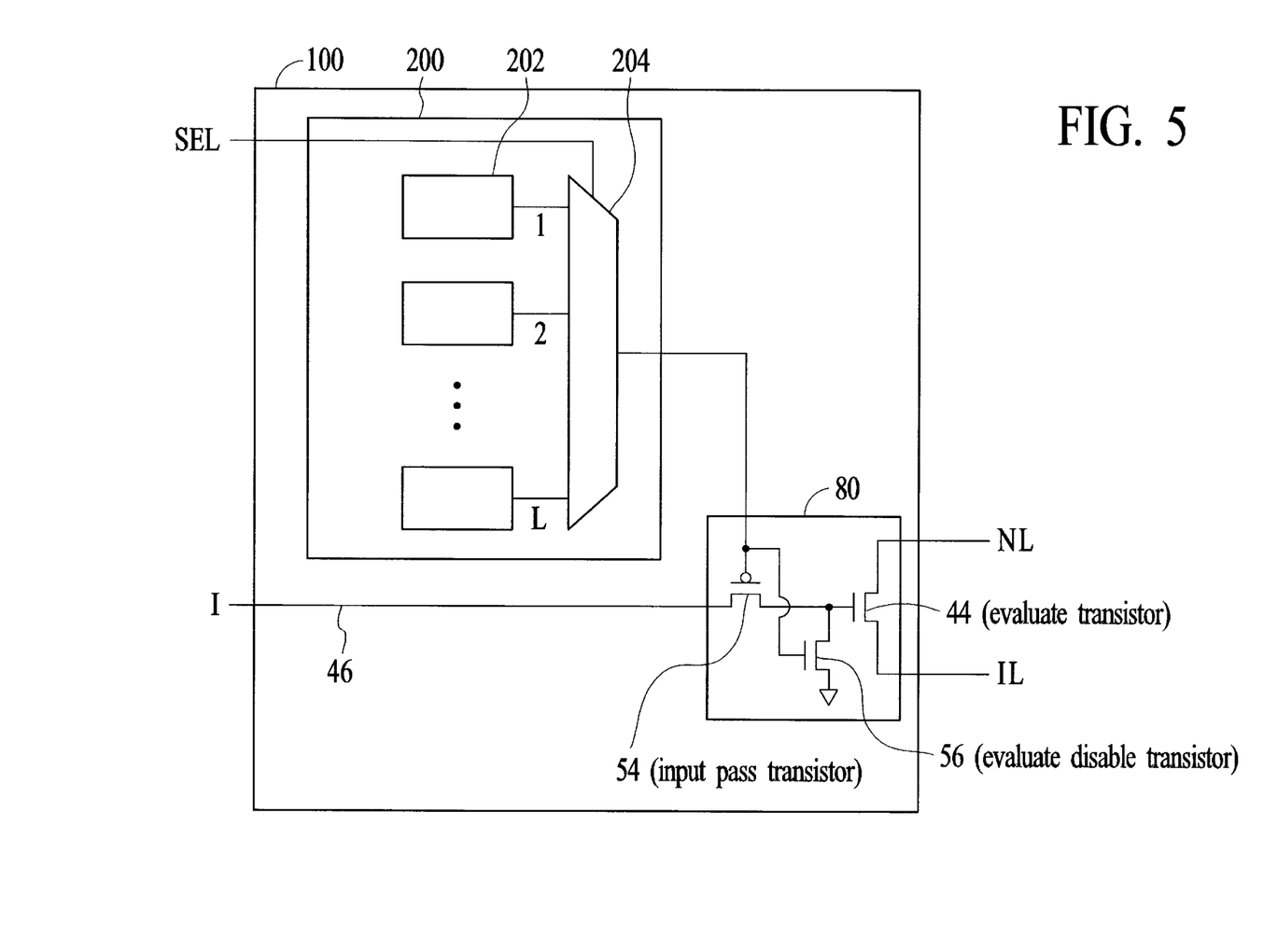
FIG. 5 shows a configurable evalute module with built-in configurations in accordance with the present invention.

The configurable evaluate module 100 comprises an input control module 200, an input pass transistor 54, an evaluate transistor 44, and an evaluate disable transistor 56. The input control module 200 comprises a plurality of input control settings 202, a multiplexor 204 and the L-bit SEL signal that selects one of the L input control settings. To select the configuration j, the jth signal in SEL is asserted and all other signals in SEL are de-asserted to allow the jth configuration to affect the signal I. Each input control setting is hardwired to the low or high logic state, depending on whether the input signal 46 should or should not affect the evaluate transistor 44, respectively, when the setting is selected. The input signal 46 and the SEL signal should not change during the evaluate phase to avoid falsely discharging the NL output.

The output of the input control module 200 enables either the input pass transistor 54 or the evaluate disable transistor 56 at any given time. When the input pass transistor 54 is turned on, the input signal 46 is allowed to affect the evaluate transistor 44, such that the evaluate transistor 44 is turned on or off if the input signal 46 is high or low, respectively. When the evaluate disable transistor 56 is turned on instead, the input signal 46 cannot affect the evaluate transistor 44.

Figure 6:
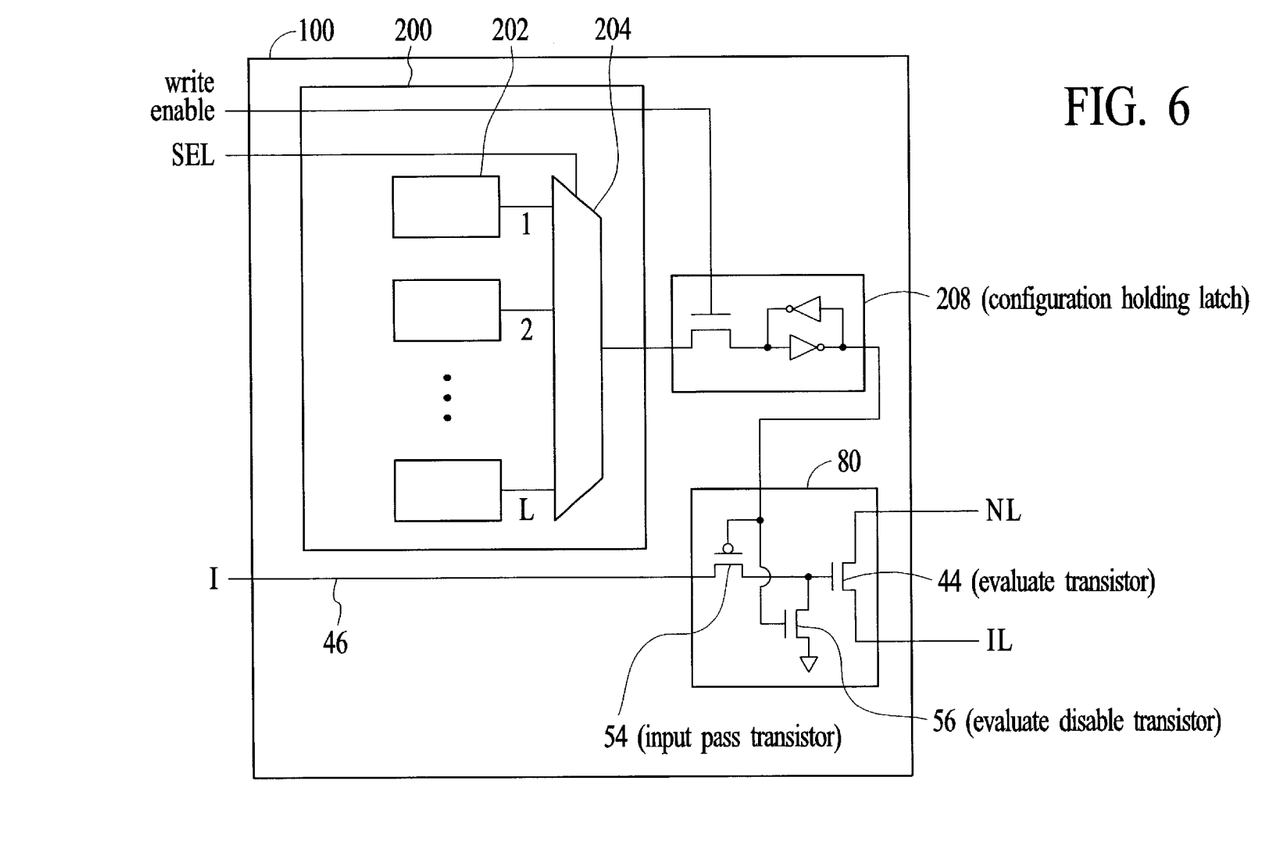
FIG. 6 shows a configurable evalute module with built-in configurations and a configuration holding latch in accordance with the present invention.

To simplify the generation of the SEL signal, it may be desirable to place configuration holding latch 208 that can be written only during the precharge phase, as shown in FIG. 6. The latch 208 allows the SEL signal to be changed in precharge and evaluate phases.

Dynamic PLA with Built-in Reprogrammable Configurations

Figure 7:
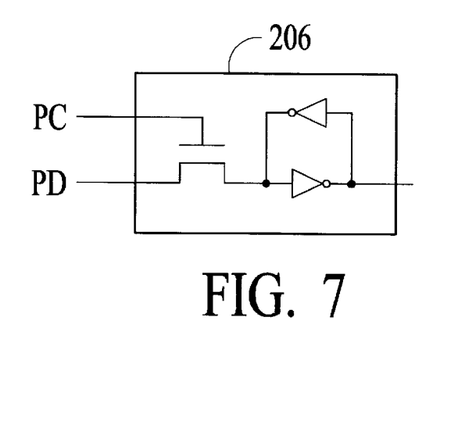
FIG. 7 shows a latch that can be used as a reprogrammable evaluate module in accordance with the present invention.

An input control setting 202 can be made "reprogrammable" by using a storage element, such as a latch 206 shown in FIG. 7, instead of hardwiring the setting to the low or high logic state.

Figure 8:
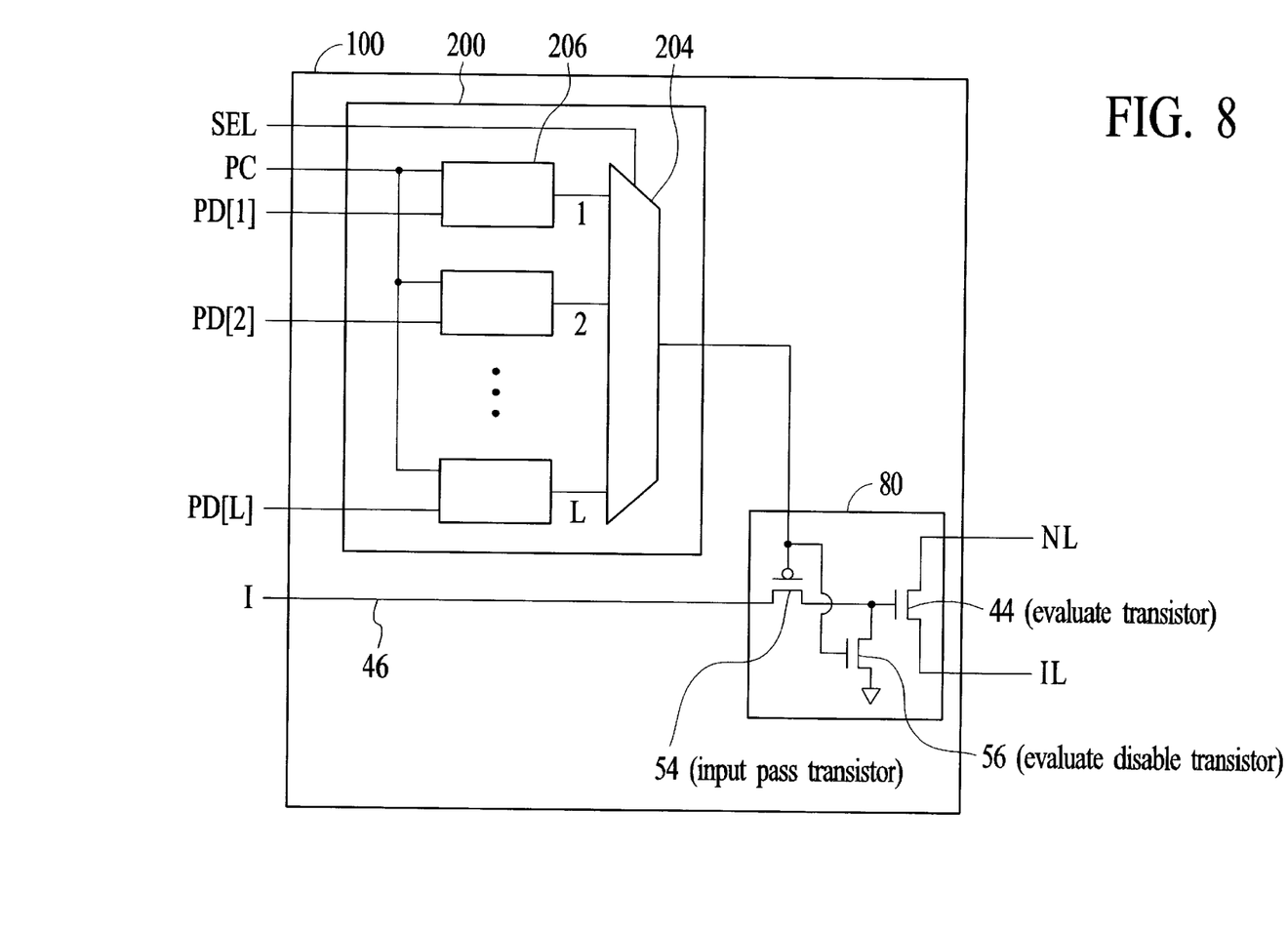
FIG. 8 shows a configurable evaluate module using latches as input control settings to provide reprogrammability in accordance with the present invention.
Figure 9:
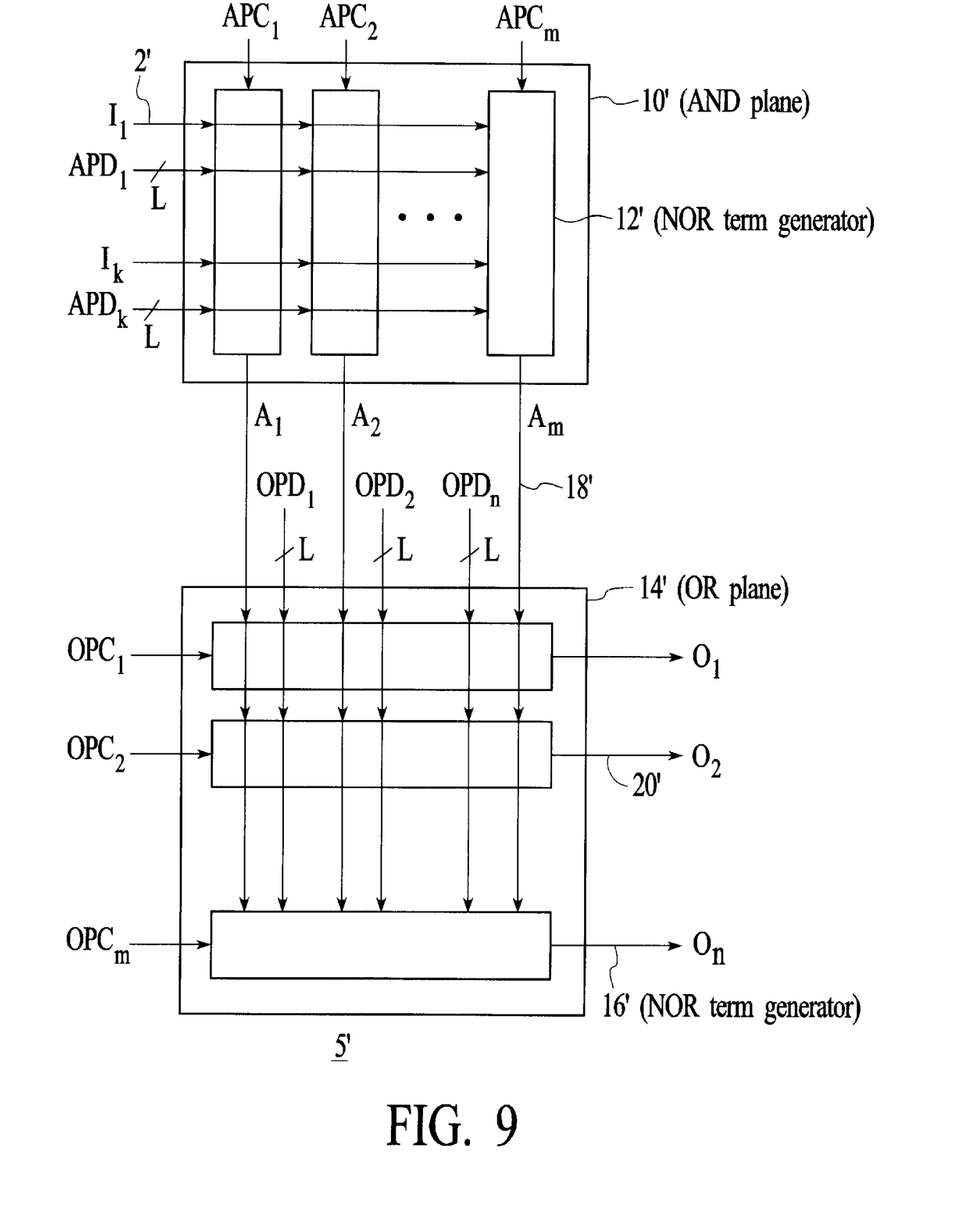
FIGS. 9 and 10 show configurable DPLA that is populated with reprogrammable evaluate modes, as shown in FIG. 8, in accordance with the present invention.
Figure 10:
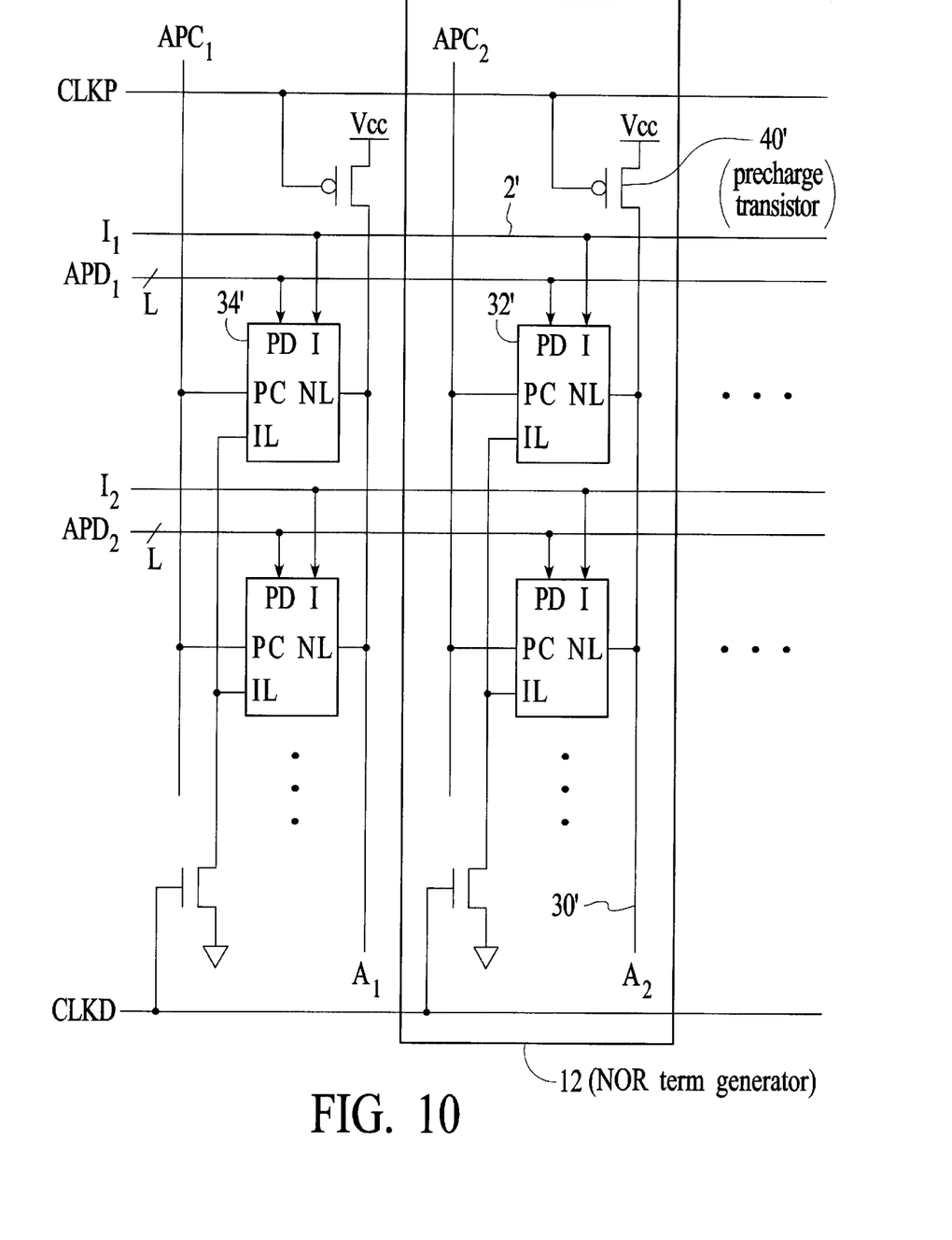

FIG. 8 shows a configurable evaluate module in which all input control settings are made reprogrammable. To program all of the L input control latches 206 in one cycle, the desired values are placed on the L-bit PD signal and the PC signal is asserted (set to high and then to low). Each NOR term generator has a dedicated PC signal but shares the K number of L-bit PD signals with other generators in the AND plane so that all input control settings in the AND plane can be reprogrammed in M number of cycles, as shown in FIGS. 9 and 10. Similarly, each NOR term generator in the OR plane has a dedicated PC signal but shares the M number of L-bit PD signals so that all input control settings in the OR plane can be reprogrammed in N number of cycles. The connection of the SEL signal is not shown in these two figures. The PD, PC, input signal 46 and the SEL signals should not change during the evaluate phase to avoid falsely discharging the NL output.

Figure 11:
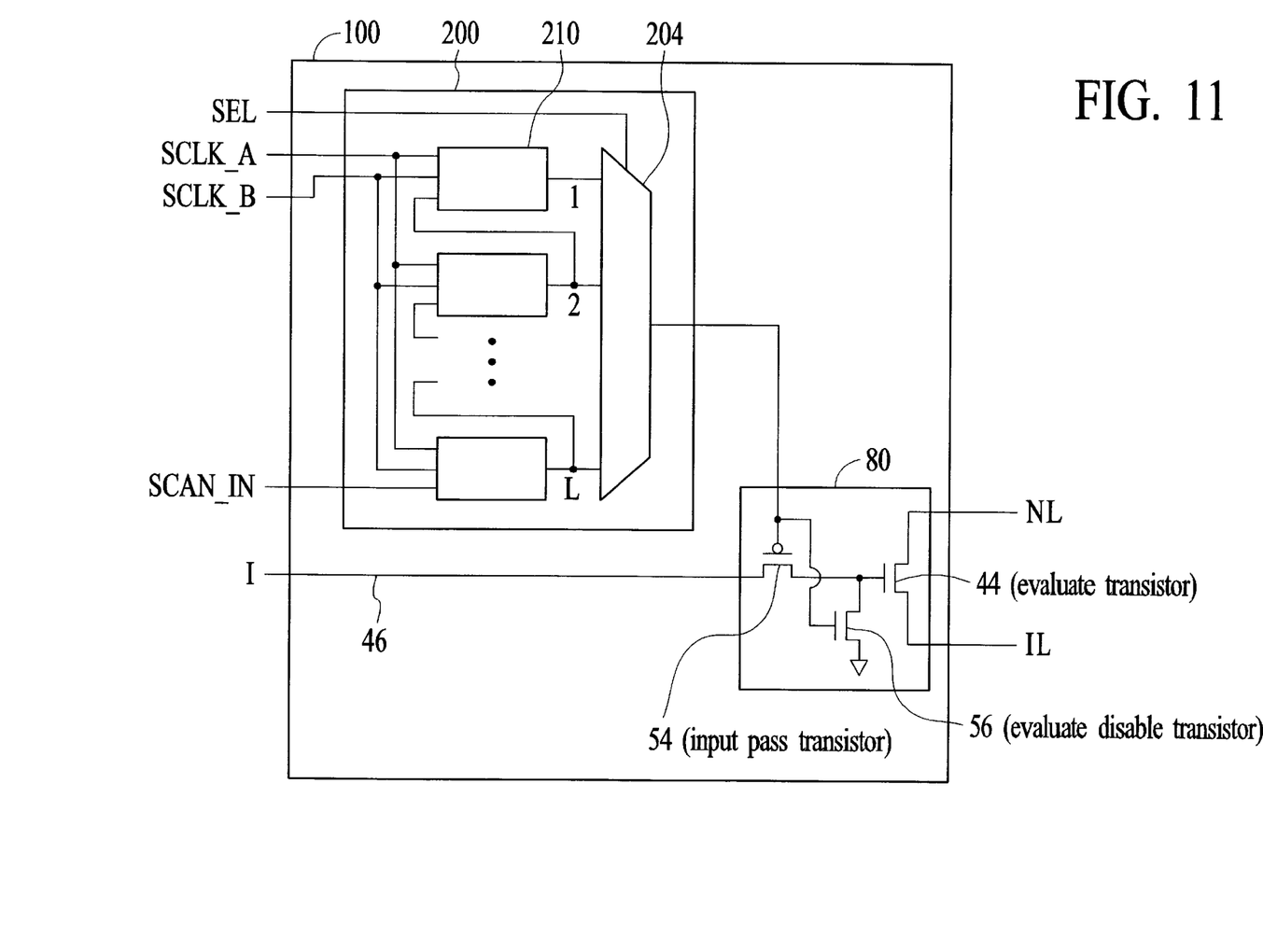
FIG. 11 shows all of the input control settings that are scan registers that can be connected in one scan chain to minimize the number of PD and PC signals.
Figure 12:
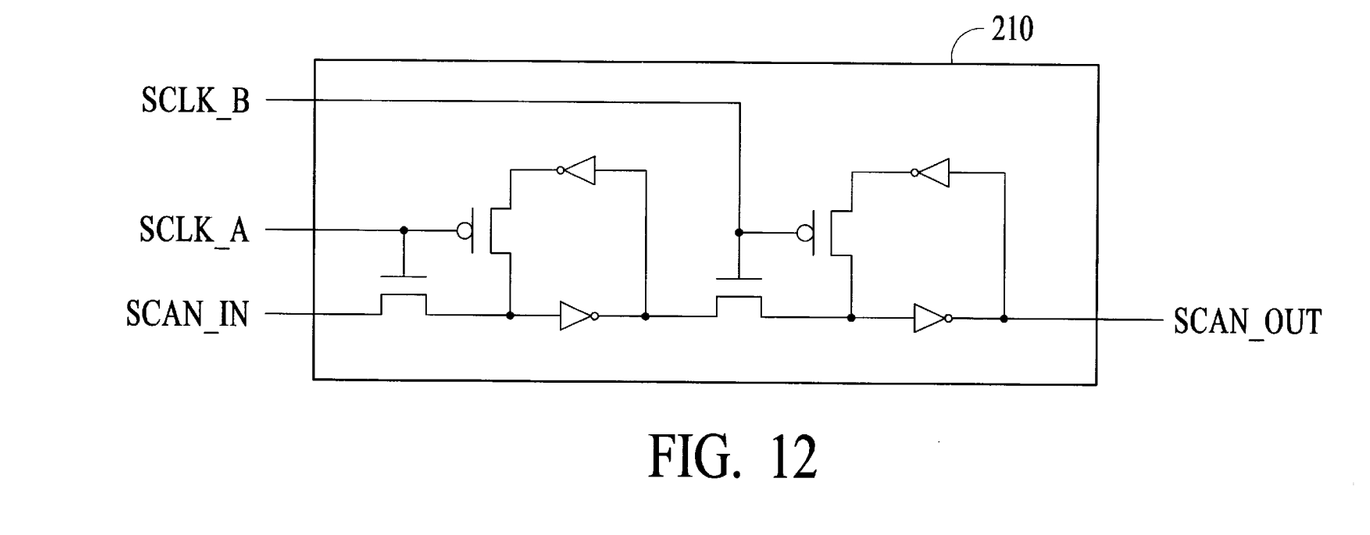
FIG. 12 shows a scan register.

All of the input control settings that are "reprogrammable" can be connected in one scan chain to minimize the number of PD and PC signals, as shown in FIG. 11. In this arrangement, the input control settings are built using scan registers 210, shown in FIG. 12, and are connected as one scan chain. That is, the scan_in signal is connected to the program data input of the first scan register whose output is then connected to the program data input of the next scan register, and so forth. The output of the last scan register in the scan chain scan_out is then connected to the scan_in of first scan register in another configurable evaluate module 100, resulting in all of the scan registers in the logic planes being connected as one scan chain. The scan control signals sclk_a and sclk_b are connected to all scan registers in the same scan chain.

Dynamic PLA with Partitioned Configuration Control

Figure 13:
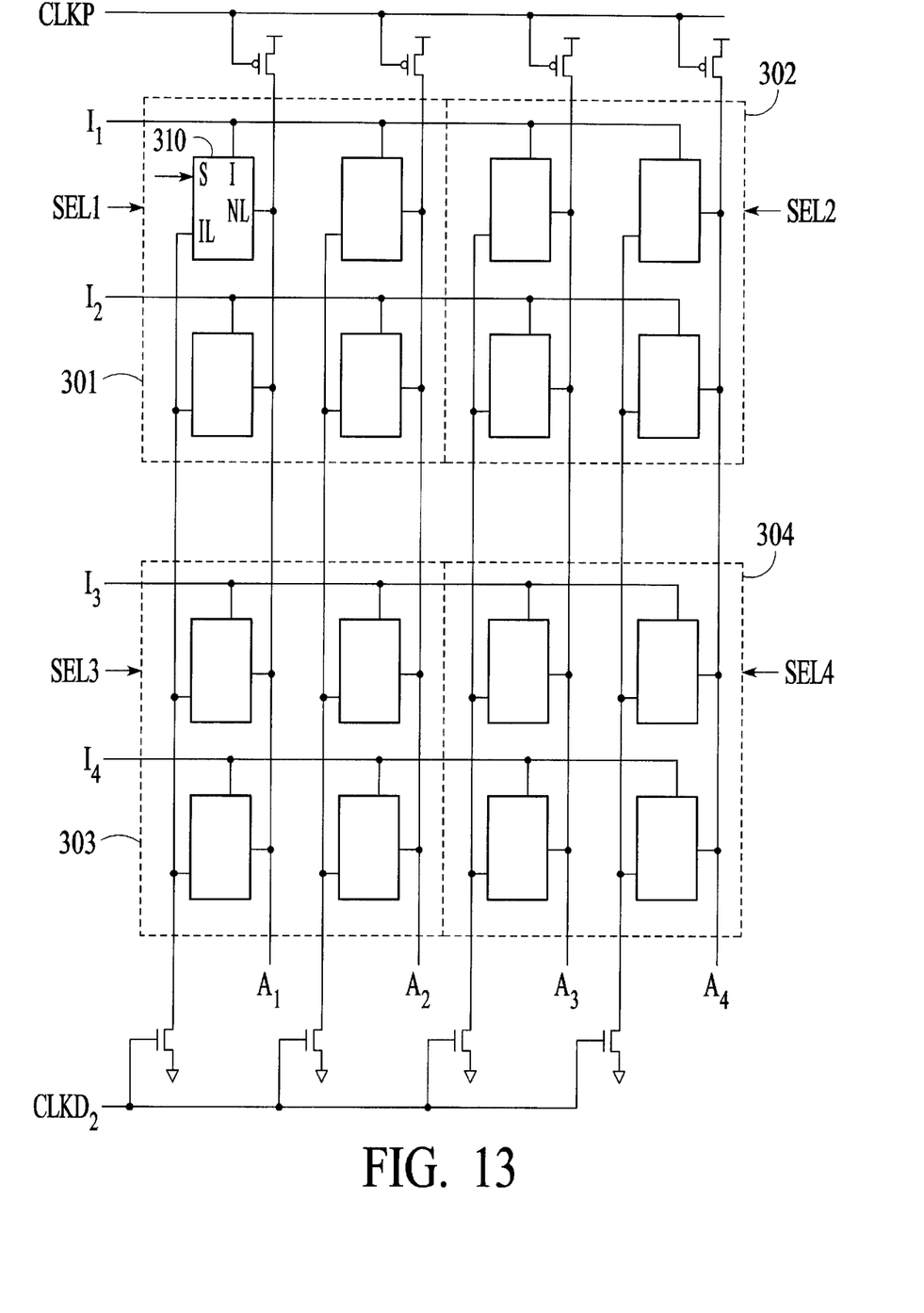
FIG. 13 shows the AND plane can be divided into four sub-arrays, each sub-array having a separate configuration select signal SEL1, SEL2, SEL3 and SEL4, respectively.

A dynamic PLA with built-in hardwired or reprogrammable configurations can be partitioned into multiple sub-arrays with independent configuration controls by providing multiple SEL signals. For instance, the AND plane can be divided into four sub-arrays 301, 302, 303, and 304, as shown in FIG. 13. The SEL1 signal is connected to all configurable evaluate modules 310 in the sub-array 301. Similarly, the SEL2, SEL3, and SEL4 signals are used in the sub-arrays 302, 303, and 304, respectively. Note that the input signals I1 and I2 are connected to the two upper sub-arrays 301 and 302 while the input signals I3 and I4 are connected to the two lower sub-arrays 303 and 304. Similarly, the AND term generators A1 and A2 are connected to the two left sub-arrays 301 and 303 while the A3 and A4 are connected to the two right sub-arrays 302 and 304.

An AND term output is still affected by the settings of all of the configurable evaluate modules that are connected to it. For example, the A2 AND term output signal is affected by the settings of the configurable evaluate modules in both the sub-arrays 301 and 303.

A configurable array can be partitioned into different sized sub-arrays. The widths of the configuration select (SEL) signals can also be different, since the width of a SEL signal depends on the number of configurations used in the associated sub-array. If a sub-array uses only one configuration, then it obviously does not need a SEL signal.

Dynamic PLA with Partitioned Evaluate Control

Figure 14:
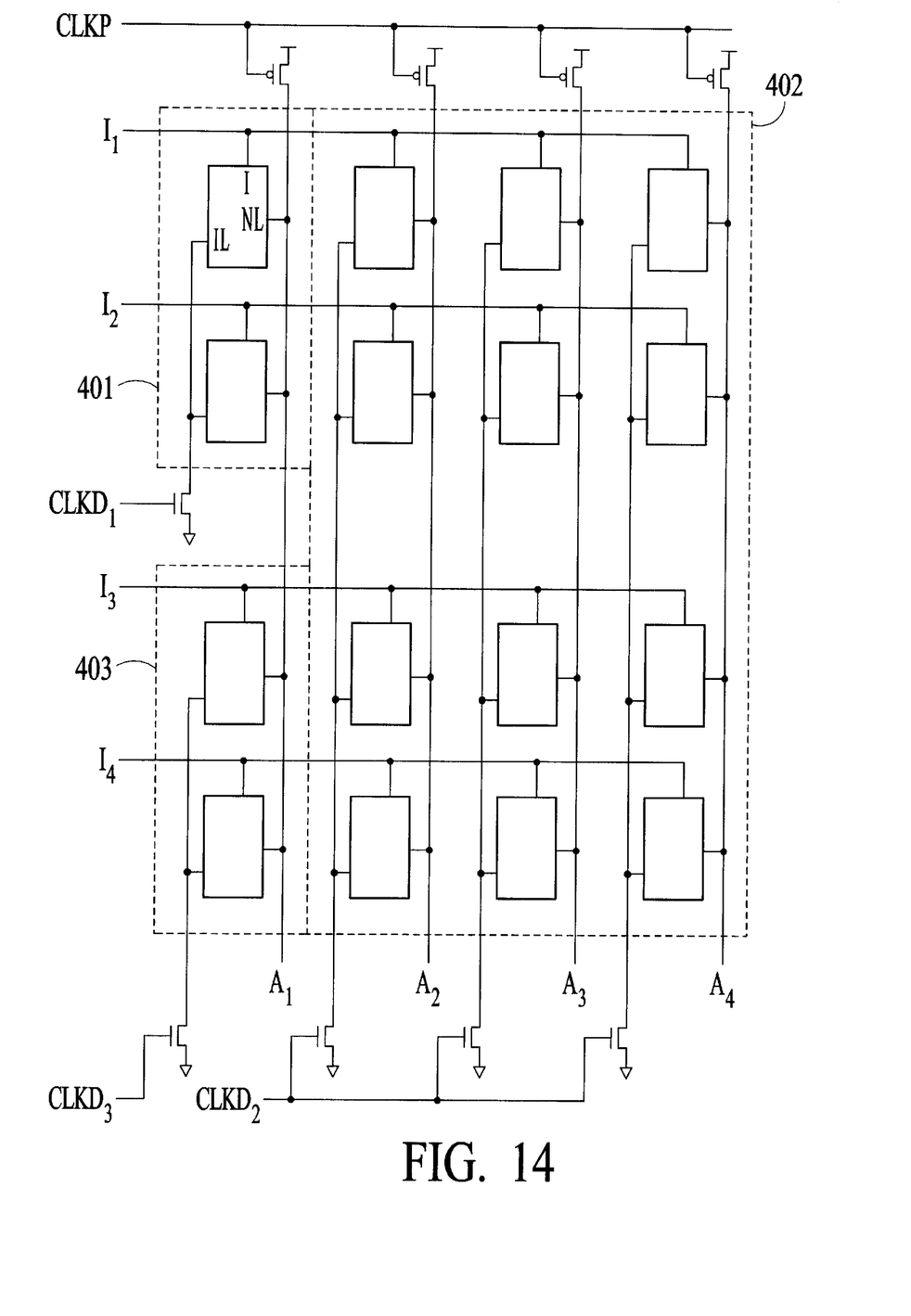
FIG. 14 shows an array partitioned into three sub-arrays, each sub-array having a separate evaluate control clock CLKD1, CLKD2 and CLKD3, respectively.

The AND or OR plane of any dynamic PLA can be partitioned into multiple sub-arrays of varying sizes, each sub-array having a separate evaluate control clock. For example, FIG. 14 shows an array partitioned into three sub-arrays 401, 402 and 403, each array having a separate evaluate control clock CLKD1, CLKD2 and CLKD3, respectively. The advantage of this type of partition is that it is easy to control whether or not all of the evaluate modules in an sub-array affect the associated AND or OR term signals. That is, one evaluate control clock can override the inputs and the configuration settings for the associated sub-array so that all of the AND or OR term outputs that are connected to the sub-array are not affected by the sub-array. The same AND or OR term outputs can still be affected by other sub-arrays. For example, by not asserting the CLKD1 signal while asserting the CLKD3 signal during the evaluate phase, the inputs I1 and I2 are made to not affect the AND term A1 while I3 and I4 are allowed to affect $A_1$.

Accordingly, a configurable dynamic PLA in accordance with the present invention provides for multiple programs onto one dynamic PLA and allows one of the multiple programs to be selected at any given time, making the array "configurable" after the array is built. In addition, If the evaluate module are made reprogrammable, the PLA is both configurable and programmable.

Although the present invention has been described in accordance with the embodiments shown, one of ordinary skill in the art will readily recognize that there could be variations to the embodiments and those variations would be within the spirit and scope of the present invention. Accordingly, many modifications may be made by one or ordinary skill in the art without departing from the spirit and scope of the appended claims.

What is claimed is:

1. A dynamic programmable logic array (DPLA) comprising:
    at least one logic plane;
    at least one configurable evaluate module within the at least one logic plane, the at least one configurable evaluate module including a first input, a control input, an input pass transistor coupled to the first control input, and an evaluate transistor coupled to the input pass transistor, wherein each of the input pass transistor and the evaluate transistor including a gate, source and drain, wherein the gate of the input pass transistor is coupled to the first control input, and the source of the input pass transistor is coupled to the first input, the drain of the input pass transistor is coupled to the gate of the evaluate transistor; and
    an evaluate disable transistor; the evaluate disable transistor, including a gate, source and drain, the gate is coupled to the first control input, the source is coupled to the gate of the evaluate transistor, the drain is coupled to the ground, and the control input enables one of the input pass transistor or the evaluate disable transistor at any given time.

2. The DPLA of claim 1 which includes an input control module coupled to the control input for providing a plurality of input control settings, wherein the input control module comprises a plurality of input control settings, a multiplexer for receiving the control settings and a configuration select signal coupled to the multiplexer for selecting one of the control settings.

3. The DPLA of claim 2 which includes a latch whose data input is coupled to the output of the input control module, whose output is coupled to the gate of the input pass transistor, and whose write enable is changed only during the precharge phase.

4. The DPLA of claim 2 wherein an input control setting is coupled to the supply voltage or the ground.

5. The DPLA of claim 3 wherein an input control setting is coupled to the supply voltage or the ground.

6. The DPLA of claim 2 wherein an input control setting comprises a reprogrammable latch.

7. DPLA of claim 3 wherein an input control setting comprises a reprogrammable latch.

8. The DPLA of claim 2 wherein an input control setting comprises a scan register.

9. The DPLA of claim 3 wherein an input control setting comprises a scan register.

10. The DPLA of claim 8 wherein a plurality of scan registers are coupled in a scan chain.

11. The DPLA of claim 9 wherein a plurality of scan registers are coupled in a scan chain.

12. The DPLA of claims 4, 5, 6, 7, 8, 9, 10, or 11 wherein the at least one logic plane can be partitioned into sub-arrays utilizing a separate evaluate control clock for each of the sub-arrays.

13. The DPLA of claims 4, 5, 6, 7, 8, 9, 10, or 11 wherein the at least one logic plane can be partitioned into sub-arrays utilizing a separate configuration select signal for each of the sub-arrays.

14. A dynamic programmable logic array (DPLA) comprising:
a first logic plane;
a first configurable evaluate module within the first logic plane;
a second logic plane coupled to the first logic plane and for providing an output; and
a second configurable evaluate module within the second logic plane wherein each of the first and second configurable evaluate modules includes a first input, a control input, an input pass transistor coupled to the first control input, and an evaluate transistor coupled to the input pass transistor and wherein each of the input pass transistor and the evaluate transistor including a gate, source and drain, wherein the gate of the input pass transistor is coupled to the first control input, and the source of the input pass transistor is coupled to the first input, the drain of the input pass transistor is coupled to the gate of the evaluate transistor.

15. The DPLA of claim 14 which includes an evaluate disable transistor includes a gate, source and drain, the gate is coupled to the first control input, the source is coupled to the gate of the evaluate transistor, the drain is coupled to the ground, and the control input enables one of the input pass transistor or the evaluate disable transistor at any given time.

16. The DPLA of claims 15 which includes an input control module coupled to the control input for providing a plurality of input control settings, wherein the input control module comprises a plurality of input control settings, a multiplexer for receiving the control settings and a configuration select signal coupled to the multiplexer for selecting one of the s control settings.

17. The DPLA of claim 16 which includes a latch whose data input is coupled to the output of the input control module, whose output is coupled to the gate of the input pass transistor, and whose write-enable is changed only during the precharge phase.

18. The DPLA of claim 16 wherein an input control setting is coupled to the supply voltage or the ground.

19. The DPLA of claim 17 wherein an input control setting is coupled to the supply voltage or the ground.

20. The DPLA of claim 16 wherein an input control setting comprises a reprogrammable latch.

21. The DPLA of claim 17 wherein an input control setting comprises a reprogrammable latch.

22. The DPLA of claim 16 wherein an input control setting comprises a scan register.

23. The DPLA of claim 17 wherein an input control setting comprises a scan register.

24. The DPLA of claim 22 wherein a plurality of scan registers are coupled in a scan chain.

25. The DPLA of claim 23 wherein a plurality of scan registers are coupled in a scan chain.

26. The DPLA of claim 14 wherein the first logic plane comprises an AND logic plane.

27. The DPLA of claim 14 or 26 wherein the second logic plane comprises an OR logic plane.

28. The DPLA of claim 26 wherein the AND logic plane can be partitioned into sub-arrays utilizing a separate evaluate control clock for each of the sub-arrays.

29. The DPLA of claim 27 wherein the at least one logic plane can be partitioned into sub-arrays utilizing a separate evaluate control clock for each of the sub-arrays.

30. The DPLA of claim 26 wherein the AND logic plane can be partitioned into sub-arrays utilizing a separate configuration select signal for each of the sub-arrays.

31. The DPLA of claim 27 wherein the at least one logic plane can be partitioned into sub-arrays utilizing a separate configuration select signal for each of the sub-arrays.

32. A reconfigurable evaluate module for use in a logic array comprising:
a first input;
a control input;
an input pass transistor coupled to the first control input; and
an evaluate transistor coupled to the input pass transistor wherein each of the input pass transistor and the evaluate transistor including a gate, source and drain, wherein the gate of the input pass transistor is coupled to the first control input, and the source of the input pass transistor is coupled to the first input, the drain of the input pass transistor is coupled to the gate of the evaluate transistor, and
an evaluate disable transistor, the evaluate disable transistor includes a gate, source and drain, the gate is coupled to the first control input, the source is coupled to the gate of the evaluate transistor, the drain is coupled to the ground, and the control input enables one of the input pass transistor or the evaluate disable transistor at any given time.

33. The reconfigurable evaluate module of claim 32 which includes an input control module coupled to the control input for providing a plurality of input control settings, wherein the input control module comprises a plurality of input control settings, a multiplexer for receiving the control settings and a configuration select signal coupled to the multiplexer for selecting one of the control settings.

34. The reconfigurable evaluate module of claim 33 which includes a latch whose data input is coupled to the output of the input control module, whose output is coupled to the gate of the input pass transistor, and whose write enable is changed only during the precharge phase.

35. The reconfigurable evaluate module of claim 33 wherein an input control setting is coupled to the supply voltage or the ground.

36. The reconfigurable evaluate module of claim 34 wherein an input control setting is coupled to the supply voltage or the ground.

37. The reconfigurable evaluate module of claim 33 wherein an input control setting comprises a reprogrammable latch.

38. The reconfigurable evaluate module of claim 34 wherein an input control setting comprises a reprogrammable latch.

39. The reconfigurable evaluate module of claim 33 wherein an input control setting comprises a scan register.

40. The reconfigurable evaluate module of claim 34 wherein an input control setting comprises a scan register.

41. The reconfigurable evaluate module of claim 39 wherein a plurality of scan registers are coupled in a scan chain.

42. The reconfigurable evaluate module of claim 40 wherein a plurality of scan registers are coupled in a scan chain.

* * * * *